United States Patent
Bindig et al.

(10) Patent No.: US 9,478,726 B2
(45) Date of Patent: Oct. 25, 2016

(54) ACTUATOR MODULE HAVING A MULTI-LAYER ACTUATOR ARRANGED IN A HOUSING AND A CONTINUOUSLY EXTREMELY LOW LEAKAGE CURRENT AT THE ACTUATOR SURFACE

(71) Applicants: Reiner Bindig, Bindlach (DE); Hans-Jürgen Schreiner, Hersbruck (DE)

(72) Inventors: Reiner Bindig, Bindlach (DE); Hans-Jürgen Schreiner, Hersbruck (DE)

(73) Assignee: CeramTec GmbH, Plochingen (DE)

( * ) Notice: Subject to any disclaimer, the term of this patent is extended or adjusted under 35 U.S.C. 154(b) by 95 days.

(21) Appl. No.: 14/371,495

(22) PCT Filed: Jan. 10, 2013

(86) PCT No.: PCT/EP2013/050393
§ 371 (c)(1),
(2) Date: Jul. 14, 2014

(87) PCT Pub. No.: WO2013/104710
PCT Pub. Date: Jul. 18, 2013

(65) Prior Publication Data
US 2014/0368086 A1 Dec. 18, 2014

(30) Foreign Application Priority Data
Jan. 11, 2012 (DE) .................. 10 2012 200 328

(51) Int. Cl.
*H01L 41/083* (2006.01)
*H01L 41/053* (2006.01)

(52) U.S. Cl.
CPC ......... *H01L 41/053* (2013.01); *H01L 41/0533* (2013.01); *H01L 41/0536* (2013.01); *H01L 41/083* (2013.01)

(58) Field of Classification Search
CPC ............. H01L 41/053; H01L 41/0533; H01L 41/0536; H01L 41/083
USPC .................................................. 310/328, 344
See application file for complete search history.

(56) References Cited

U.S. PATENT DOCUMENTS

| | | |
|---|---|---|
| 4,845,399 A | 7/1989 | Yasuda et al. |
| 5,092,360 A | 3/1992 | Watanabe et al. |
| 5,281,885 A | 1/1994 | Watanabe et al. |
| 5,406,164 A | 4/1995 | Okawa et al. |
| 6,208,026 B1 | 3/2001 | Bindig et al. |
| 6,943,482 B2 | 9/2005 | Bindig et al. |
| 7,314,895 B2 | 1/2008 | Freedman et al. |
| 7,358,646 B2 | 4/2008 | Asano et al. |

(Continued)

FOREIGN PATENT DOCUMENTS

| | | |
|---|---|---|
| DE | 3330538 A1 | 3/1985 |
| DE | 4036287 A1 | 5/1991 |

(Continued)

*Primary Examiner* — J. San Martin
(74) *Attorney, Agent, or Firm* — Norton Rose Fulbright US LLP

(57) ABSTRACT

The invention relates to actuator module (22) having a piezoceramic multilayer actuator (1) arranged in a casing (23). In order to avoid an increase in conductivity and hence rising leakage current at the actuator surface even after a long period of use, the invention proposes that the casing (23) is hermetically sealed, and a chamber (24) is arranged between the multilayer actuator (1) and the casing (23), which chamber is entirely or partially filled with a medium (21) that chemically transforms and/or binds water.

14 Claims, 5 Drawing Sheets

(56) References Cited

U.S. PATENT DOCUMENTS

Figure 1:
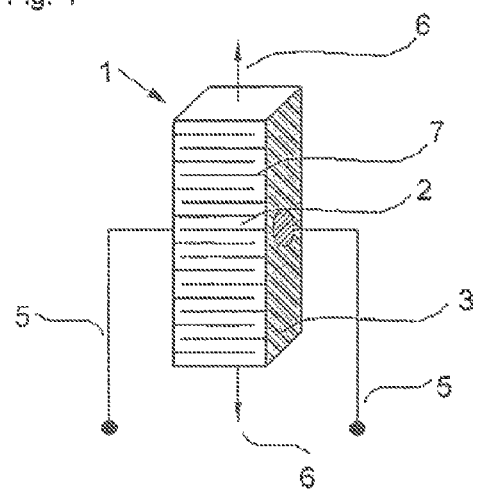

| | | | |
|---|---|---|---|
| 7,531,944 B2 * | 5/2009 | Oakley | F02M 63/0026 310/328 |
| 8,248,750 B2 | 8/2012 | Biggs et al. | |
| 8,679,575 B2 | 3/2014 | Biggs et al. | |
| 2004/0217672 A1 * | 11/2004 | Bindig | H01L 41/0533 310/344 |
| 2010/0025065 A1 * | 2/2010 | Goat | H01L 41/0533 174/50 |

FOREIGN PATENT DOCUMENTS

| | | |
|---|---|---|
| DE | 10211107 A1 | 2/2003 |
| EP | 0 844 678 B1 | 8/2002 |
| JP | 07-226541 A | 8/1995 |

* cited by examiner

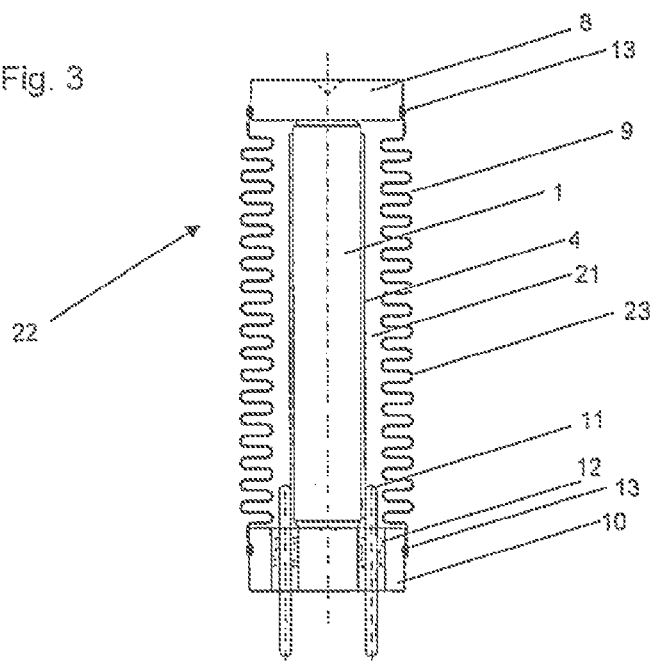
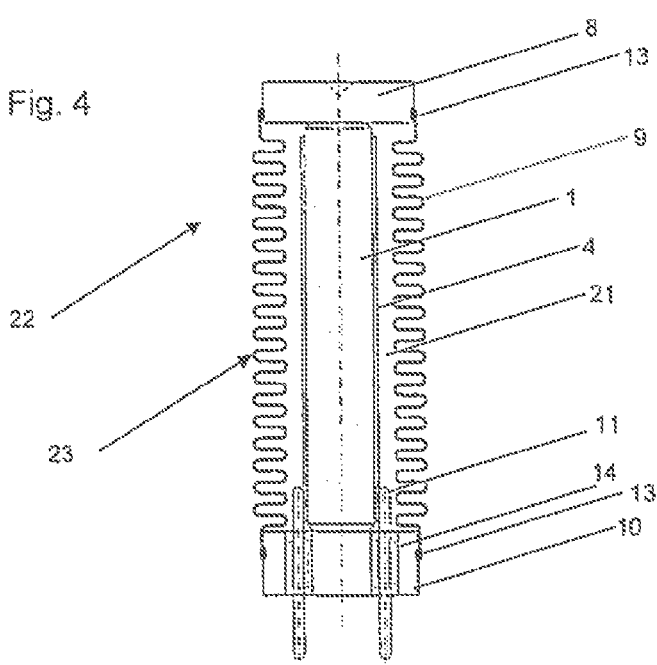

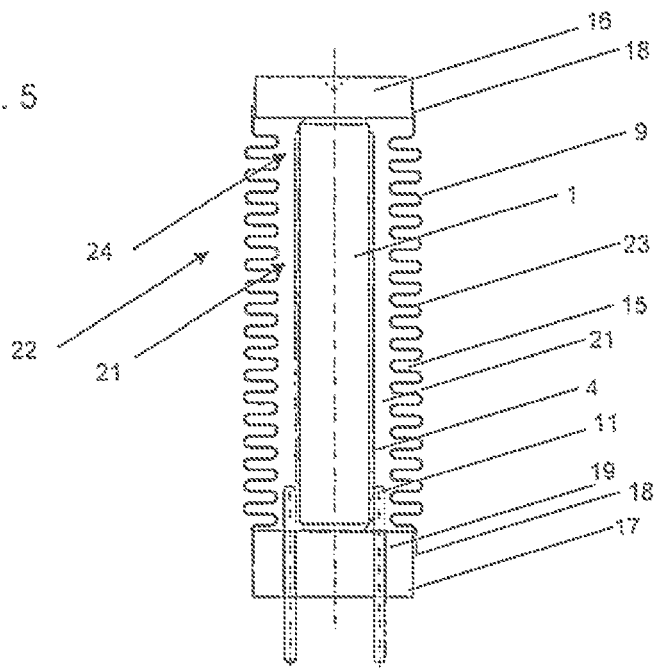
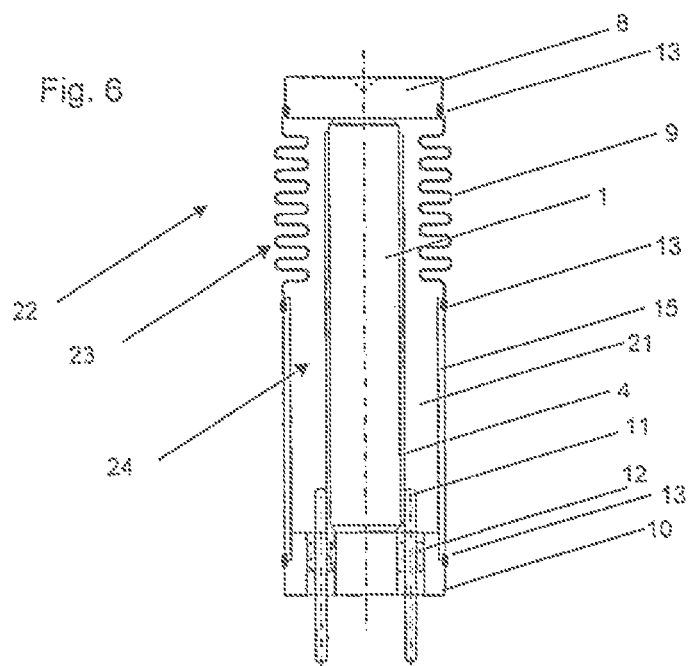

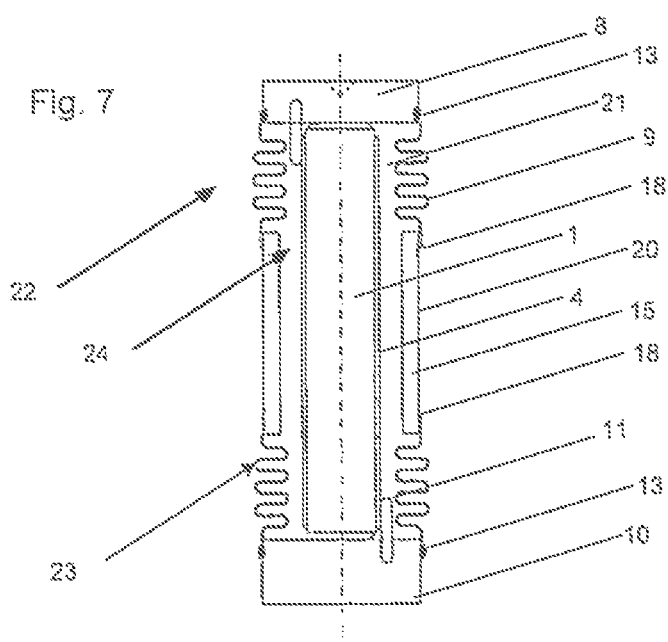

ACTUATOR MODULE HAVING A MULTI-LAYER ACTUATOR ARRANGED IN A HOUSING AND A CONTINUOUSLY EXTREMELY LOW LEAKAGE CURRENT AT THE ACTUATOR SURFACE

This application is a §371 of International Application No. PCT/EP2013/050393 filed Jan. 10, 2013, and claims priority from German Patent Application No. 10 2012 200 328.2 filed Jan. 11, 2012.

The invention relates to an actuator module having a piezoceramic multilayer actuator arranged in a casing.

Known piezoceramic multilayer actuators 1 (see FIG. 1) are composed of stacked thin layers of piezoelectrically active material 2, e.g. lead zirconate titanate (PZT), interlaced with conductive internal electrodes 7, which are brought to the actuator surface e.g. in an alternating manner. A base metal-plating 3 connects these internal electrodes 7 such that they are connected electrically in parallel and are combined into two groups constituting the two terminals 5 of the multilayer actuator 1. If an electrical voltage is applied across the terminals 5, it is transferred to all the internal electrodes 7 in parallel, resulting in an electric field in all the layers of active material 2, which is thereby mechanically deformed. The sum of all these mechanical deformations is available at the end faces of the actuator as a useable expansion 6 and/or force.

Piezoceramic multilayer actuators have a monolithic design in the prior art, i.e. the active material, while in the "green film" state prior to sintering, is provided with internal electrodes by a screen-printing process using precious-metal paste, compressed into actuator stacks, pyrolized and then sintered to produce the monolithic actuator.

The surfaces of the actuator body are then machined in a shaping process, generally by grinding. A base metal-plating 3 is applied to the actuator (see FIG. 2) in the area where the internal electrodes 7 are fed out e.g. by electroplating methods or metal-paste screen-printing. This base metal-plating 3 is reinforced by applying a metallic external electrode 4 e.g. a patterned metal plate, a wire mesh or wire gauze. The electrical terminal 5 is soldered to this external electrode 4. Before or after soldering on the terminals 5, the actuator is encased in an electrically insulating coating that also protects the actuator surfaces from mechanical damage.

Figure 2:
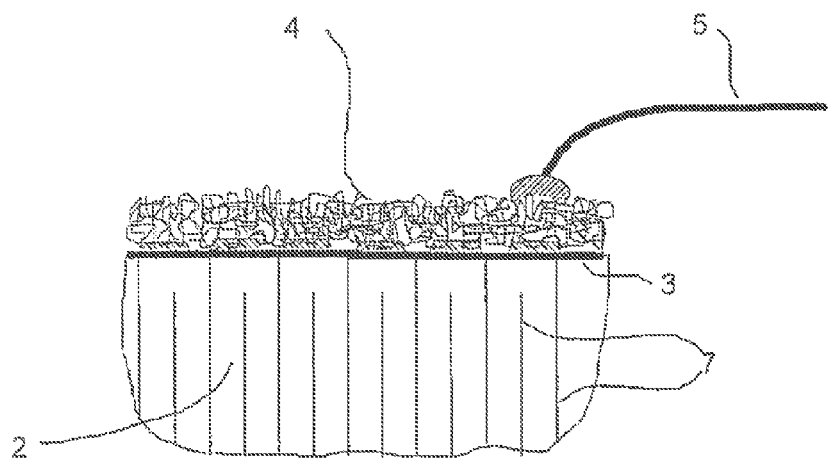

FIG. 1 shows a piezoceramic multilayer actuator according to the prior art, and FIG. 2 shows as an improvement an external electrode 4 between the base metal-plating 3 and the terminals 5.

EP 0 844 678 B1, DE 33 30 538 A1, DE 40 36 287 C2, U.S. Pat. No. 5,281,885, U.S. Pat. No. 4,845,399, U.S. Pat. No. 5,406,164 and JP 07-226541 A describe in detail the design and manufacture of such actuators and external electrodes.

Numerous applications of multilayer actuators (also referred to below generally as actuators) require that the rated voltage can be applied to the actuator over long periods of time without the properties of the actuator changing. Typical applications are final-control and positioning drives, which move to a defined position and must sometimes hold this position for months and years. This requirement cannot be met by actuators according to the prior art described above.

Figure 8:
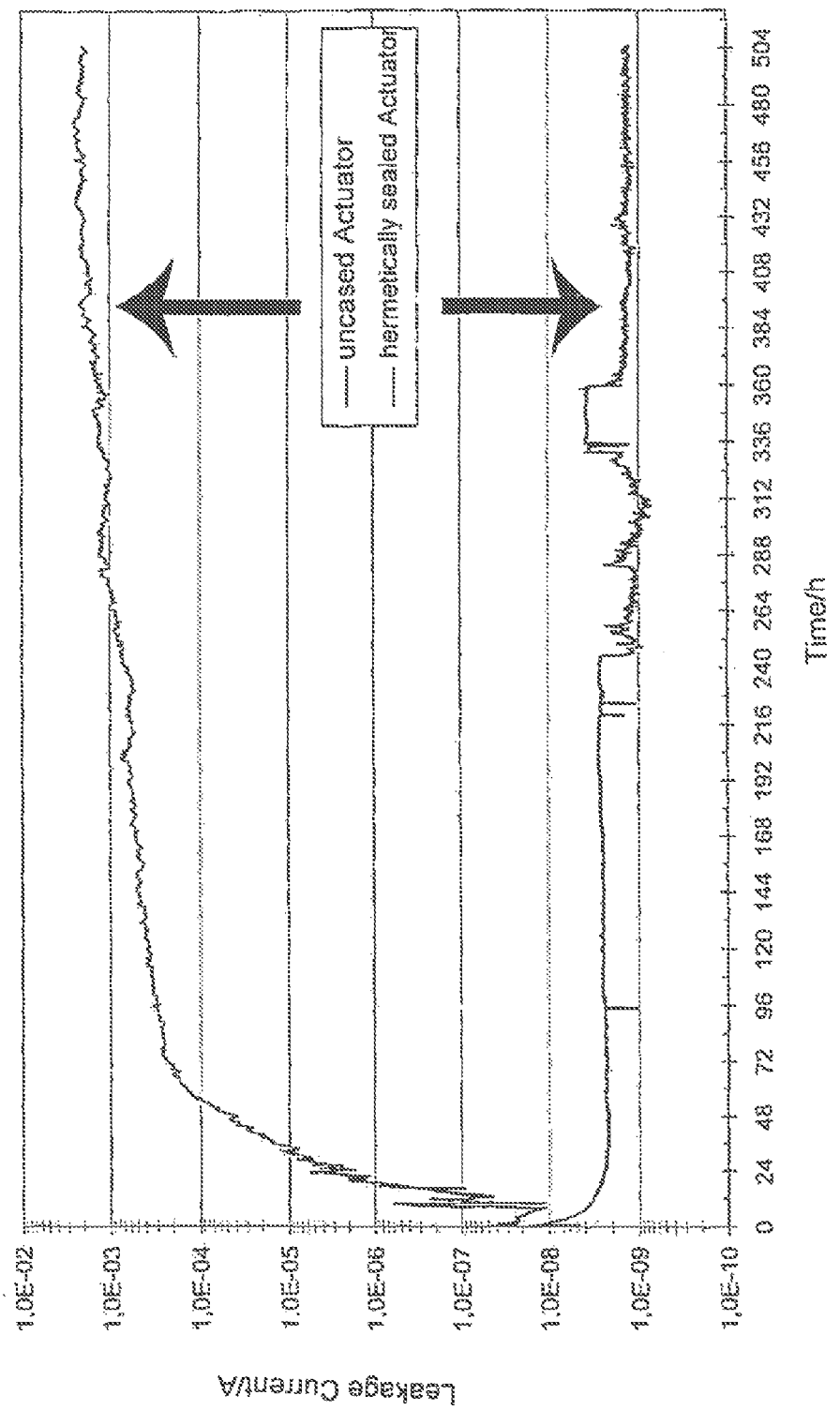

The reason for this is that the high electrical field strength attracts from the environment polar molecules, usually water vapor, to the actuator surface. This water vapor penetrates all known polymer coatings, albeit at different rates, ultimately resulting in an increased conductivity and rising leakage current at the actuator surface. The leakage current rises until, as a result of the likewise rising actuator temperature, equilibrium is established between water-vapor adsorption caused by the electric field and desorption caused by the actuator temperature. The graph in FIG. 8 shows the typical leakage current curve over time for an actuator of dimensions 7×7×30 mm$^3$ for an internal field strength of 2000 V/mm under normal laboratory environmental conditions.

If ceramic coatings or glass containers are used as a cover, the water vapor penetrates through microcracks in the coating which are inevitably formed by operation of the actuator.

Even encapsulating with a suitable potting compound in a metal casing does not result in success because even the extremely small amounts of water that are contained in the potting compound or penetrate during the encapsulation stage, are enough to trigger the effect.

The expansion joints always needed on the base and top of the casing form weak points through which moisture penetrates, as do the terminals or connecting wires that have to be fed to the outside through the coating or casing. Using plastic-insulated wires does not achieve the objective for the reasons given above.

The object of the invention is to improve an actuator module having a piezoceramic multilayer actuator arranged in a casing such that even after a long period of use there is no increase in conductivity and hence rising leakage current at the actuator surface.

This object is achieved according to the invention by the features of claim 1.

The fact that the casing is hermetically sealed, and a chamber is arranged between the multilayer actuator and the casing, which chamber is entirely or partially filled with a medium that chemically transforms and/or binds water, means that penetrating water vapor cannot result in increased conductivity and hence rising leakage current at the actuator surface. The term water is understood to include water vapor.

Only very little water or water vapor finds its way through the hermetically sealed casing into the inside of the casing, and the medium then transforms or binds this small amount, which then cannot be deposited on the actuator surface.

There are various suitable media. In one embodiment, the medium consumes the water reactively. The medium preferably contains polyurethane resin or the medium is composed of a powdered drying agent.

Electrical terminals for the multilayer actuator are fed into the casing. In a preferred embodiment, the casing is composed of a casing top, a casing sheath and a casing base. The electrical terminals are preferably integrated hermetically in the casing base in an electrically insulating manner.

In one embodiment this is done by the casing base being made of metal and the electrical terminals being fed into the inside of the casing via a glass bushing or ceramic bushing in the casing base. Glass bushings must be designed to be air-tight and water-tight.

Alternatively, the casing base is made of ceramic and has metal-plated apertures into which the electrical terminals are soldered. The casing base preferably comprises a metallized area around the outer circumference, by means of which a hermetically sealed joint is made between the casing base and the casing sheath.

In one embodiment, the casing top is made of ceramic and preferably comprises a metallized area around the outer circumference, by means of which a hermetically sealed joint is made between the casing base and the casing sheath.

In order for the actuator to be able to expand unhindered and without causing damage to the casing, in a preferred embodiment, the casing sheath is composed entirely or partially of a metal bellows.

The casing sheath composed entirely or partially of a metal bellows preferably generates the required mechanical pre-stress for the multilayer actuator.

In one embodiment, the casing sheath is made partially or entirely of ceramic, and the electrical terminals are arranged in the casing base and/or the casing top.

The casing base and/or the casing top can also be made of a flexible membrane. In this case, a metal bellows can be dispensed with.

The casing base, the casing sheath and the casing top are preferably joined to produce a hermetic seal by welding, in particular laser welding, brazing using metal solder, soldering using glass solder, or soft-soldering.

The invention is described further below with reference to FIGS. 3 to 7.

Actuator module refers to the unit comprising actuator 1 and casing.

It is proposed to fit piezoceramic actuators 1 in a metallic or ceramic casing 23, in which the terminals 11 are integral components of the casing base 10, 17. Glass bushings 12, for example, can be used to seal the terminals against the surroundings with a gas-tight seal. The casing 23 is hermetically sealed by welded joint 13, for example. The casing shape is chosen such that a small mechanical pre-stress is exerted on the actuator 1 in order to hold it in position. The casing 23 must be at least partially resilient so that it does not oppose the travel of the actuator 1 with too great a resistance. This is achieved by designing the casing 23 or the casing sheath 9 as a metal bellows or using a metal membrane to cap the casing 23. The stiffness of the casing is preferably small with respect to the actuator stiffness.

In the casing 23 is provided a medium 21, which either fixes or chemically transforms the water molecules trapped when the medium is added. Extremely small amounts of water, such as are typically adsorbed at surfaces, are sufficient to produce leakage currents. It is therefore necessary to deactivate these extremely small amounts of water and to seal hermetically the casing 23 by soldering using metal or glass 18, 19 or by welding 13.

This results in the following advantages:

Such hermetically encapsulated actuator modules 22 exhibit constantly extremely low leakage currents even when they are operated continuously at the rated field strength.

FIG. 8 shows a graph of the leakage current curve on an actuator 1 encapsulated in this way. Actuator dimensions and other parameters are the same as for the un-encapsulated actuator as shown in FIG. 8. The leakage current of the encapsulated actuator 1 is about 1,000,000 times smaller than that of the un-encapsulated actuator.

When manufacturing the actuator 1, a low-sintering piezoceramic, e.g. according to DE 198 40 488 A1, having an organic binder system, is prepared as a 125 μm thick film. A commercially available internal-electrode paste is applied to this film by screen-printing. A multiplicity of such films are stacked and compressed into a laminate, with several films at the top and/or bottom end of the laminate remaining without internal electrodes 7 in order to produce an inactive region on which electrical contact can be made later to the actuator 1. The laminate is diced into individual, rod-shaped actuators, which are sintered at 900° C.-1100° C., preferably 1000° C. After grinding the actuator surfaces, the silver base metal-plating 3 is applied to the contact faces using a screen-printing/firing process. The external electrodes 4 made of metal wire mesh are soldered onto said base metal-plating. The actuators 1 are then insulated by a commercially available silicone varnish to provide protection from mechanical damage and electrical insulation during the subsequent testing processes. The actuators 1 can then be polarized and electrically tested.

An actuator casing 23 is made by using as the casing sheath 9 a metal bellows that is slightly shorter than the actuator 1. Areas are provided at both ends of the casing sheath 9 onto which a casing top 8 can be welded. The inner diameter of the casing sheath 9 or more precisely of the metal bellows is such that the actuator 1 does not touch the wall of the casing sheath 9 when it is inserted in the metal bellows.

A casing base 10, 17 for the casing 23 is made by forming two holes in a plane-parallel metal disc. Connecting pins as terminals 11 are inserted into these holes in a hermetically sealed and electrically insulating manner e.g. by means of glass solder. This is a glass bushing 12.

A plane-parallel metal disc without holes acts as the casing top 8.

The actuator 1 is now fixed to the casing base 10, 17 by means of an epoxy adhesive such that the external electrodes 4 of the actuator touch the two contact pins as terminals 11. The contact between external electrode 4 and the contact pins is made by soldering, welding or adhesive bonding using a conductive adhesive.

The actuator casing 23 is put over the actuator 1 and welded to the casing base 10, 17 e.g. using a laser. The actuator 1 now protrudes slightly beyond the metal bellows which acts as casing sheath 9. The casing 23 must not be touched during this process.

The gap or chamber 24 between actuator 1 and actuator casing is then filled with a water-consuming medium 21 e.g. with a polyurethane resin, which as it hardens absorbs and chemically transforms water, releasing $CO_2$, for instance, in the process.

The casing top 8 is then placed onto the actuator 1, the casing 9 is pulled onto the top 8 and fixed thereto with a hermetic seal e.g. by laser welding.

The procedure described above for manufacturing monolithic multilayer actuators, as described in the introductory part, is discussed in detail in the patent literature and other publications. The procedure according to the invention for encapsulating the actuators does not need to follow the work sequence described. A person skilled in the art can also derive similar procedures that produce the same result.

The term hermetically is understood to mean air-tight and water-tight.

DRAWINGS

FIG. 1: shows the structure of a monolithic multilayer actuator

FIG. 2: shows a detailed view of FIG. 1

FIG. 3: shows a hermetically sealed casing 23 having metal bellows as the casing sheath 9, casing top 8, casing base 10 having contact pins as the terminals 11 in glass bushings 12. The casing 23 is welded 13. Casing top 8, casing sheath 9 and casing base 10 are made of metal.

FIG. 4: shows a hermetically sealed casing 23 having metal bellows as the casing sheath 9, casing top 8, casing base 10 having contact pins as the terminals 11 in soldered ceramic bushings 14. The casing is welded 13.

FIG. 5: shows a hermetically sealed casing having metal bellows as the casing sheath 9, ceramic top as the casing top 16 having metal plating around the circumference, ceramic base as the casing base 17 having metal plating around the circumference, and soldered-in contact pins as the terminals 11. The casing is soldered 18.

FIG. 6: shows a hermetically sealed casing having two-piece casing sheath 9 composed of metal bellows and metal tube 15 which are welded together, metal casing top 8, metal casing base 10 having contact pins as the terminals 11 in glass bushings 12. The casing is welded 13.

FIG. 7: shows a hermetically sealed casing having three-piece casing sheath 9 composed of two metal bellows which are soldered to a partially metal-plated ceramic tube 20, metal casing top 8 and metal casing base 10. The contact pins as the terminals 11 are connected directly to the external electrodes 4 of the actuator 1. The casing is welded 13.

FIG. 8: shows the leakage current behavior of an actuator 1 according to the prior art without casing, and the leakage current behavior of an actuator 1 encapsulated according to the invention as an actuator module 22.

MEANING OF THE REFERENCES

1: monolithic piezoceramic multilayer actuator
2: piezoelectrically active material
3: base metal-plating
4: external electrode
5: connecting wires for the supply voltage
6: direction of movement of the actuator during operation
7: internal electrodes
8: casing top; metal disc
9: casing sheath; metal bellows
10: casing base; metal disc containing holes
11: terminals; metal contact pins
12: glass bushing made of glass solder
13: welding; welded joint
14: ceramic bushing; metal-plated ceramic tube soldered to casing base and contact pin
15: metal tube
16: casing top; ceramic disc metal-plated around the circumference
17: casing base; ceramic disc containing internally metal-plated holes and metal-plated around the circumference
18: soldered joints: metal bellows to base, metal bellows to top or metal bellows to ceramic tube
19: soldered joints: contact pin to base
20: ceramic tube; metal-plated at both ends around the circumference
21: water-binding or water-transforming medium as filler

The invention claimed is:

1. An actuator module comprising:
a piezoceramic multilayer actuator arranged in a casing, wherein the casing is hermetically sealed, and a chamber is arranged between the multilayer actuator and the casing, which chamber is entirely or partially filled with a medium that chemically transforms water, binds water, or both, wherein the casing has a casing sheath, a casing jacket and a casing base (10, 17) and in the casing (23) electrical receiving terminals (11) for the multilayer actuator (1) are fed into the casing,
wherein the casing top is welded onto the casing sheath;
wherein the casing base is made of ceramic and has metal-plated apertures into which the electrical terminals are soldered,
wherein the casing base comprises metal and the electrical terminals are fed into the inside of the casing via a glass bushing or ceramic bushing in the casing base.

2. The actuator module as claimed in claim 1, wherein the medium consumes the water reactively.

3. The actuator module as claimed in claim 1, wherein the medium contains polyurethane resin.

4. The actuator module as claimed in claim 1, wherein the medium is composed of a powdered drying agent.

5. The actuator module as claimed in claim 1, wherein the electrical terminals are integrated hermetically in the casing base in an electrically insulating manner.

6. The actuator module as claimed in claim 1, wherein the casing base comprises metal and the electrical terminals are fed into the inside of the casing via the ceramic bushing.

7. The actuator module as claimed in claim 1, wherein the casing base comprises a metallized area around the outer circumference, by means of which a hermetically sealed joint is made between the casing base and the casing sheath.

8. The actuator module as claimed in claim 1, wherein the casing top is made of ceramic and comprises a metallized area around the outer circumference, by means of which a hermetically sealed joint is made between the casing base and the casing sheath.

9. The actuator module as claimed in claim 1, wherein the casing sheath is composed entirely or partially of a metal bellows.

10. The actuator module as claimed in claim 1, wherein the casing sheath comprises entirely or partially a metal bellows generates the required mechanical pre-stress for the multilayer actuator.

11. The actuator module as claimed in claim 1, wherein the casing sheath is made partially or entirely of ceramic, and the electrical terminals are arranged in at least one of the casing base and the casing top.

12. The actuator module as claimed in claim 1, wherein at least one of the casing base or the casing top are made of a flexible membrane.

13. The actuator module as claimed in claim 1, wherein the casing base, the casing sheath and the casing top are joined to produce a hermetic seal by welding, brazing using metal solder, soldering using glass solder, or soft-soldering.

14. The actuator module as claimed in claim 1, wherein the casing base, the casing sheath and the casing top are joined to produce a hermetic seal by laser welding.

* * * * *